United States Patent
Dunn et al.

(10) Patent No.: US 8,218,586 B2
(45) Date of Patent: Jul. 10, 2012

(54) LITTMAN CONFIGURED FREQUENCY STEPPED LASER

(75) Inventors: Thomas James Dunn, Penfield, NY (US); Jack Weston Frankovich, Fairport, NY (US); Christopher Alan Lee, Pittsford, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 12/618,027

(22) Filed: Nov. 13, 2009

(65) Prior Publication Data

US 2010/0128746 A1 May 27, 2010

Related U.S. Application Data

(60) Provisional application No. 61/118,162, filed on Nov. 26, 2008, provisional application No. 61/118,223, filed on Nov. 26, 2008.

(51) Int. Cl.
*H01S 3/10* (2006.01)
*H01S 3/098* (2006.01)
*H01S 3/08* (2006.01)

(52) U.S. Cl. ............... 372/20; 372/18; 372/19; 372/92; 372/102

(58) Field of Classification Search ............ 372/20, 372/18, 19, 29.02, 92, 98–99, 102
See application file for complete search history.

(56) References Cited

U.S. PATENT DOCUMENTS

| | | | |
|---|---|---|---|
| 5,867,512 A * | 2/1999 | Sacher | 372/20 |
| 6,690,690 B2 | 2/2004 | Marron | 372/20 |
| 6,914,917 B2 * | 7/2005 | Pilgrim et al. | 372/20 |
| 7,133,194 B1 | 11/2006 | Kwon et al. | 359/337.21 |
| 7,209,499 B2 | 4/2007 | Farmiga et al. | 372/20 |
| 7,259,860 B2 | 8/2007 | Marron et al. | 356/451 |
| 7,268,889 B2 | 9/2007 | Kulawiec et al. | 356/511 |
| 2001/0026574 A1 * | 10/2001 | Yagi | 372/102 |
| 2004/0062281 A1 * | 4/2004 | Trutna, Jr. | 372/20 |
| 2004/0165639 A1 * | 8/2004 | Lang et al. | 372/92 |
| 2005/0129073 A1 * | 6/2005 | Nguyen et al. | 372/20 |
| 2006/0062261 A1 * | 3/2006 | Farmiga et al. | 372/20 |
| 2006/0203859 A1 * | 9/2006 | Cable et al. | 372/20 |
| 2007/0276608 A1 * | 11/2007 | Gollier et al. | 702/19 |

FOREIGN PATENT DOCUMENTS
WO   WO 2006/112971    10/2006

OTHER PUBLICATIONS

Nellen, M., Tiefenthaler, K., Lukosz, W., *Integrated Optical Input Grating Couplers as Biochemical Sensors*, (1988) Sensors and Actuators, 15, pp. 285-295.

* cited by examiner

*Primary Examiner* — Jessica Stultz
*Assistant Examiner* — Phillip Nguyen
(74) *Attorney, Agent, or Firm* — John L. Haack

(57) ABSTRACT

A wavelength tunable system including a laser having a lasing cavity and an external cavity, the cavities having a common optical axis; a reflective grating fixed in the external cavity; a collimating lens between the lasing cavity and the reflective grating; and an adjustable reflective mirror defining one end of the external cavity and optically coupled to the fixed reflective grating, the adjustable reflective mirror pivots about the fixed reflective grating, and a method of use as defined herein.

15 Claims, 5 Drawing Sheets

LITTMAN CONFIGURED FREQUENCY STEPPED LASER

CLAIMING BENEFIT OF PRIOR FILED U.S. APPLICATION

This application claims the benefit of U.S. Provisional Ser. No. 61/118,162, filed on Nov. 26, 2008. The content of this document and the entire disclosure of any publication, patent, or patent documents mention herein are incorporated by reference.

CROSS-REFERENCE TO RELATED COPENDING APPLICATION

U.S. Provisional Patent Application No. 61/118,223 filed on Nov. 26, 2008, entitled "CURRENT DRIVEN FREQUENCY-STEPPED RADIATION SOURCE AND METHODS THEREOF."

BACKGROUND

The disclosure relates to a wavelength tunable laser system and more specifically to a frequency-stepped laser system and methods thereof.

SUMMARY

In embodiments, the disclosure provides a frequency-stepped laser system having a modified Littman configuration and to methods of using the system.

BRIEF DESCRIPTION OF THE DRAWING(S)

DETAILED DESCRIPTION

Figure 1:
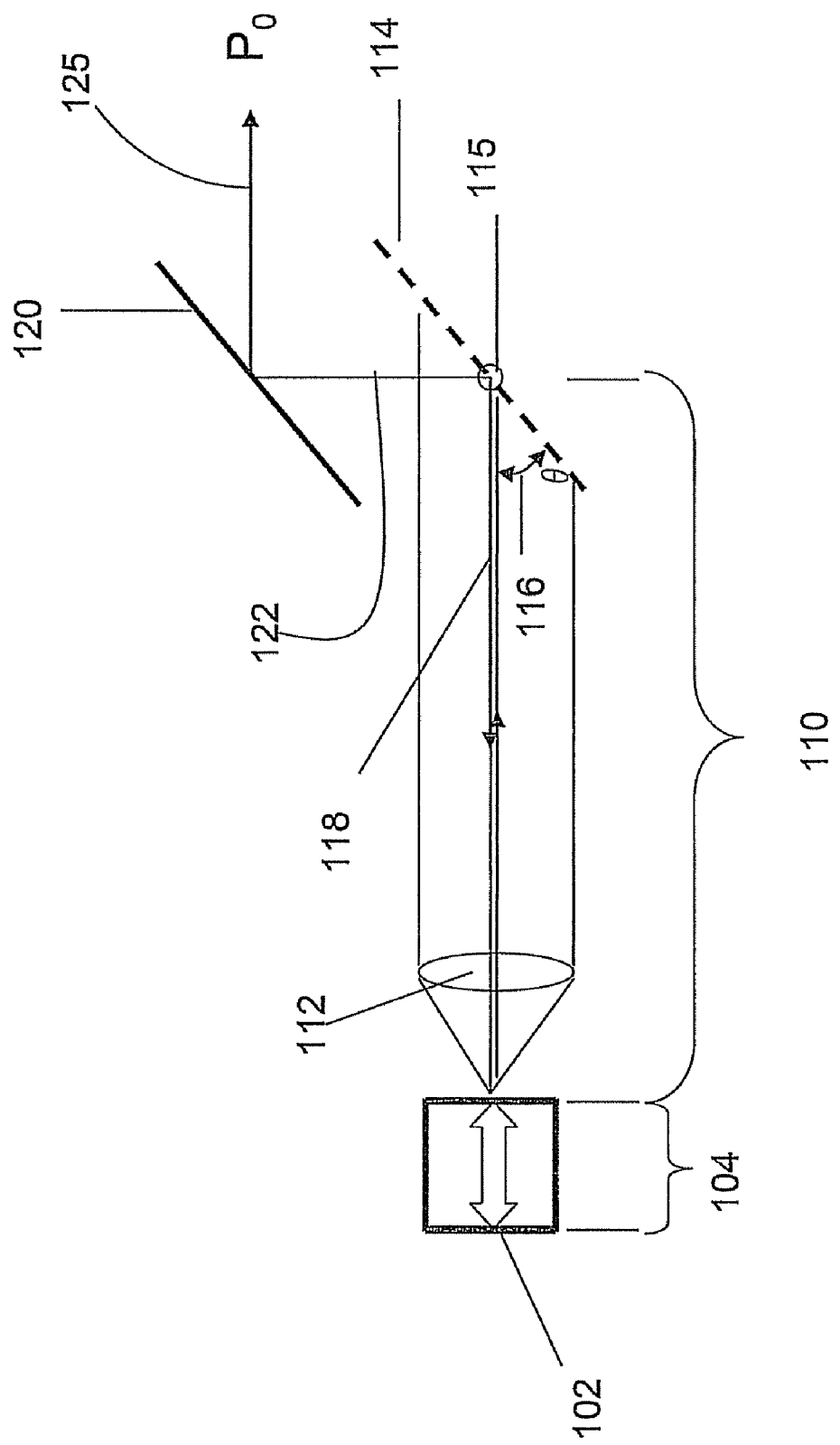
FIG. 1 shows a schematic of a known frequency-stepped, external-cavity tunable laser in the Littrow configuration.

Various embodiments of the disclosure will be described in detail with reference to drawings, if any. Reference to various embodiments does not limit the scope of the invention, which is limited only by the scope of the claims attached hereto. Additionally, any examples set forth in this specification merely set forth some of the many possible embodiments for the claimed invention.
Definitions "Wavelength tunable" or like terms refer to, for example, a laser source whose instantaneous frequency or wavelength output can be changed in a controlled manner.

"Frequency-stepped" or like terms refer to, for example, a laser source whose instantaneous frequency or wavelength output can be one of a discrete number of possible frequencies or wavelengths.

"Include," "includes," or like terms refers to inclusive or including, but is not exclusive or limited to.

"About" modifying, for example, the quantity or measure of a component, element, or aspect of the disclosure, e.g., angle, distance, a thickness, and like values, and ranges thereof, employed in describing the embodiments of the disclosure, refers to variation in the numerical quantity that can occur, for example: through typical measuring and handling procedures used for making or using the apparatus and its parts; through inadvertent error in these procedures; through differences in the manufacture or source of materials or ingredients used to carry out the methods; and like considerations. The term "about" when used in the appended claims includes equivalents to these quantities.

"Consisting essentially of" in embodiments refers, for example, to a frequency-stepped laser apparatus and system having a modified Littman configuration; and a method of making or using the system, and can include the components or steps listed in the claim, plus other components or steps that do not materially affect the basic and novel properties of any of the articles, apparatus, or system, and methods of making and use of the disclosure, such as particular components, particular materials, particular configurations, particular conditions, or like structure, material, or process variable selected. Items or aspects that may materially affect the basic properties of the components, configurations, or steps of the disclosure or that may impart undesirable characteristics to the present disclosure include, for example, non-pivotal relative motion or lateral displacement of optical components.

Thus, the claimed invention may suitably comprise, consist of, or consist essentially of, for example, an apparatus or system as defined herein; and a method for making and using the system as defined herein.

The indefinite article "a" or "an" and its corresponding definite article "the" as used herein means at least one, or one or more, unless specified otherwise.

Abbreviations, which are well known to one of ordinary skill in the art, may be used (e.g., "h" or "hr" for hour or hours, "nm" for nanometers, "µ" for microns and like abbreviations).

Specific and preferred values disclosed for components, configurations, orientations, and like aspects, and ranges thereof, are for illustration only; they do not exclude other defined values or other values within defined ranges. The apparatus, system, and methods of the disclosure include those having any value or any combination of the values, specific values, more specific values, and preferred values described herein.

Tunable laser systems are known, see e.g., WO2006112971, entitled "MODE-MATCHING SYSTEM FOR TUNABLE EXTERNAL CAVITY LASER"; U.S. Pat. No. 7,209,499, entitled "MODE-SELECTIVE FREQUENCY TUNING SYSTEM"; U.S. Pat. No. 7,268,889, entitled "PHASE-RESOLVED MEASUREMENT FOR FREQUENCY SHIFTING INTERFEROMETRY"; U.S. Pat. No. 7,259,860, entitled "OPTICAL FEEDBACK FROM MODE-SELECTIVE TUNER"; and U.S. Pat. No. 6,690,690, entitled "TUNABLE LASER SYSTEM HAVING AN ADJUSTABLE EXTERNAL CAVITY."

The above patents mention, for example, a tunable laser system that incorporates a standard uncoated laser diode which is coupled into an external cavity which cavity has a grating in the Littrow configuration. The grating angle can be adjusted to change the wavelength of the light that is fed back into the laser diode. The grating can be pivoted about an axis that is co-planar with the face of the grating and the pivot axis is parallel to the rulings on the grating face. The length of the external cavity is selected so that it is mode-matched to the fundamental laser diode. As the grating angle is continuously changed, the laser's output beam frequency will change in discrete frequency steps called mode hops. In the ideal mode-matched condition, the mode hops or frequency steps are determined by the length of the fundamental laser diode and its optical index of refraction. The above patents mention systems and their use based on a frequency stepped laser having a Littrow cavity design.

There are tunable laser systems that use different tuning methodologies that permit "continuous tuning" without any mode hops. These tunable laser systems use a laser diode in which one of the diode facets has a specialty anti-reflective (AR) coating. The mode structure of the laser is determined by the length of the external cavity and there are no competing modes from the laser diode itself. The length of the external cavity is changed while the grating angle is changed so that the same mode is used across the tuning bandwidth. This continuous tuning technique is poorly suited for tuning to a comb of frequencies. There are applications, for example, in which it is desired to step to a set of regularly spaced frequencies separated by, for example, 35 GHz within a 30 nm bandwidth, for example, from 820 to 850 nm. The continuous tuning technique suffers from at least two fundamental deficiencies including, for example: the anti-reflective coatings can be difficult to manufacture and control quality; and small grating angle changes can result in undesirable frequency changes.

A frequency-stepped laser that uses a Littrow configuration has been disclosed, see for example U.S. Pat. No. 7,209,499, and references cited therein. An external cavity tunable laser in the Littrow configuration uses a rotatably adjustable grating in which the first order reflection is directed back into the laser cavity from the grating.

External cavity tunable lasers having either the Littman or Littrow configurations are known, see for example, U.S. Pat. No. 7,133,194, entitled "Wavelength Tunable Light Source Integrated with Optical Amplifier, Beam Steering Unit, and Concave Diffraction Grating," and FIGS. 1 and 2 therein. However, these configurations attempt to achieve continuous tuning by tracking the same cavity mode across the tuning bandwidth. This requires that the external cavity length be changed in a controlled manner during tuning. In contrast, when frequency-stepped tuning is accomplished according to the present disclosure the external cavity length is fixed and mode-matched to the fundamental laser diode.

Existing continuously tunable laser systems require that excellent anti-reflective coatings be applied on the fundamental laser diode exit facet. The anti-reflective coatings can be expensive, and have failed in the field leading to short laser lifetimes. These tunable lasers also have certain inherent limitations, for example, in applications which require a repeatable scan over a pre-determined set of frequencies. Since these lasers are "continuously tunable" small angle errors can result in significant frequency errors. This limitation requires that a significant amount of scanning time be spent on "settling" to minimize frequency errors. This can lead to low throughput.

We previously reported a tunable laser technology that eliminates these limitations by using a frequency-stepping design where the external cavity tunable laser length is fixed or held constant as the laser is tuned across the bandwidth, see for example: WO2006112971, U.S. Pat. No. 7,209,499, U.S. Pat. No. 7,268,889, U.S. Pat. No. 7,259,860, and U.S. Pat. No. 6,690,690. The frequency-stepped lasers in these patent documents use a Littrow configuration in which the grating is pivotally adjustable so that it can be angle tuned to retro-reflect the first ($1^{st}$) order back into the laser cavity.

In embodiments, the disclosure provides a wavelength tunable system comprising:

a laser having a lasing cavity and an external cavity, the cavities having a common optical axis, a reflective grating fixed in the external cavity;

a collimating lens between the lasing cavity and the reflective grating; and an adjustable reflective mirror defining one end of the external cavity and optically coupled to the fixed reflective grating, the adjustable reflective mirror pivots about a locus at the fixed reflective grating.

In embodiments, the adjustable reflective mirror controllably pivots about an axis, the axis being co-planar with the face of the reflective grating. The pivotal axis can be parallel to the rulings on the face of the grating. The adjustable reflective mirror can controllably pivot about an axis of the fixed reflective grating. The wavelength of the laser's output beam can be discretely changed by successively stepping to different angles for the reflective mirror. In embodiments, the laser can be, for example, an optical amplifier. The length of the external cavity can be, for example, constant. The first order reflection can be, for example, incident on the adjustable reflective mirror. The direction of the zero-eth order reflection can be, for example, unchanged and can be, for example, not incident on the adjustable reflective mirror.

In embodiments, the disclosure provides a method for wavelength tuning a light source, the method comprising:

providing the above tunable system; and sequentially or successively orienting the adjustable reflective mirror in N respective pivot positions of angle $\theta_N$ relative to the reflective grating to output a beam having a series of respective wavelengths $\lambda_N$.

In embodiments, the disclosure provides a method for wavelength tuning a laser for use, for example, in an interrogating biosensor apparatus, the method comprising:

providing the above mentioned tunable system;

orienting the adjustable reflective mirror in a series of successive pivot positions of angle $\theta_N$ relative to the reflective grating to output a beam having a series of respective wavelengths $\lambda_N$;

directing the beam to illuminate a grating-based, waveguide biosensor;

collecting the reflected radiation from the biosensor to measure the relative intensities of the reflected radiation at the different respective wavelength $\lambda_N$; and analyzing the collected intensity versus wavelength data to determine the maximum peak wavelength response of the biosensor.

In embodiments, the disclosure provides a method for wavelength tuning a laser comprising:

providing the above mentioned tunable system; and sequentially or successively orienting the adjustable reflective mirror in N respective pivot positions of angle $\theta_N$ relative to the fixed reflective grating to output a beam having a series of respective wavelengths $\lambda_N$.

The N is an integer that can be, for example, from 2 to about 10,000, from 2 to about 200, and from 2 to about 100, including all intermediate values and ranges. The angle $\theta_N$ can be, for example, from about 1 to about 5 degrees, from about 2 to about 4 degrees, including all intermediate values and ranges, such as about 3 degrees.

In embodiments, the disclosed system can be a standalone laser or can be used with or incorporated into other articles or devices to form more complex or integrated systems that can be used in, for example, measurement applications, optical sensing such as biosensing, medical treatment, telecommunications, and like applications.

The apparatus and methods of the present disclosure are superior compared to known systems and method by providing, e.g., lower cost in manufacture and ownership, greater simplicity, and better performance. In embodiments, the disclosure provides a frequency-stepped laser system having a Littman configuration. The laser system having the Littman configuration has several benefits compared to the above mentioned Littrow laser configuration and as described below.

In embodiments, the disclosure provides a laser apparatus, system, and method for accomplishing frequency-stepped scans by using an external cavity tunable laser in the Littman configuration. An external cavity tunable laser in the Littman configuration uses a reflective optic such as a controllably pivoting reflective mirror for angle tuning the first order reflection from a laterally and rotationally positionally fixed reflective grating. A significant aspect of the disclosed system and method is that the disclosed angle tuning does not cause the zero-eth ($0^{th}$) order beam to change direction.

In embodiments the present disclosure provides a frequency-stepped laser in the Littman configuration having a fixed grating and an adjustable mirror to retro-reflect the first order reflection into the laser cavity. The disclosed system provides several benefits. Since the grating is fixed, the zero-eth order beam is also angularly fixed, so the $0^{th}$ order beam does not move during the angle tuning. Heretofore, artisan had to include a mirror that moved with the grating to minimize the motion of the zero-eth order beam. Having a fixed output beam affords cost-savings by for example, simplifying the system's mechanical configuration and eliminating issues typically associated with fiber coupling of the output beam. There are also some adjustments to the grating that are typically accomplished during laser assembly. These adjustments are significantly simplified since they can be separated from the design for the angle adjustments.

In embodiments, the disclosure provides an apparatus and method having frequency-stepped tuning of an external cavity tunable laser in a modified Littman configuration. Referring to the Figures, FIG. 1 shows a schematic of a known frequency-stepping, external-cavity tunable laser which accomplishes frequency-stepped tuning of a laser in the Littrow configuration (100), see for example, U.S. Pat. No. 7,209,499. The grating rotates around a pivot axis as shown so that the cavity length is fixed as the laser is tuned across the operating bandwidth.

Figure 2:
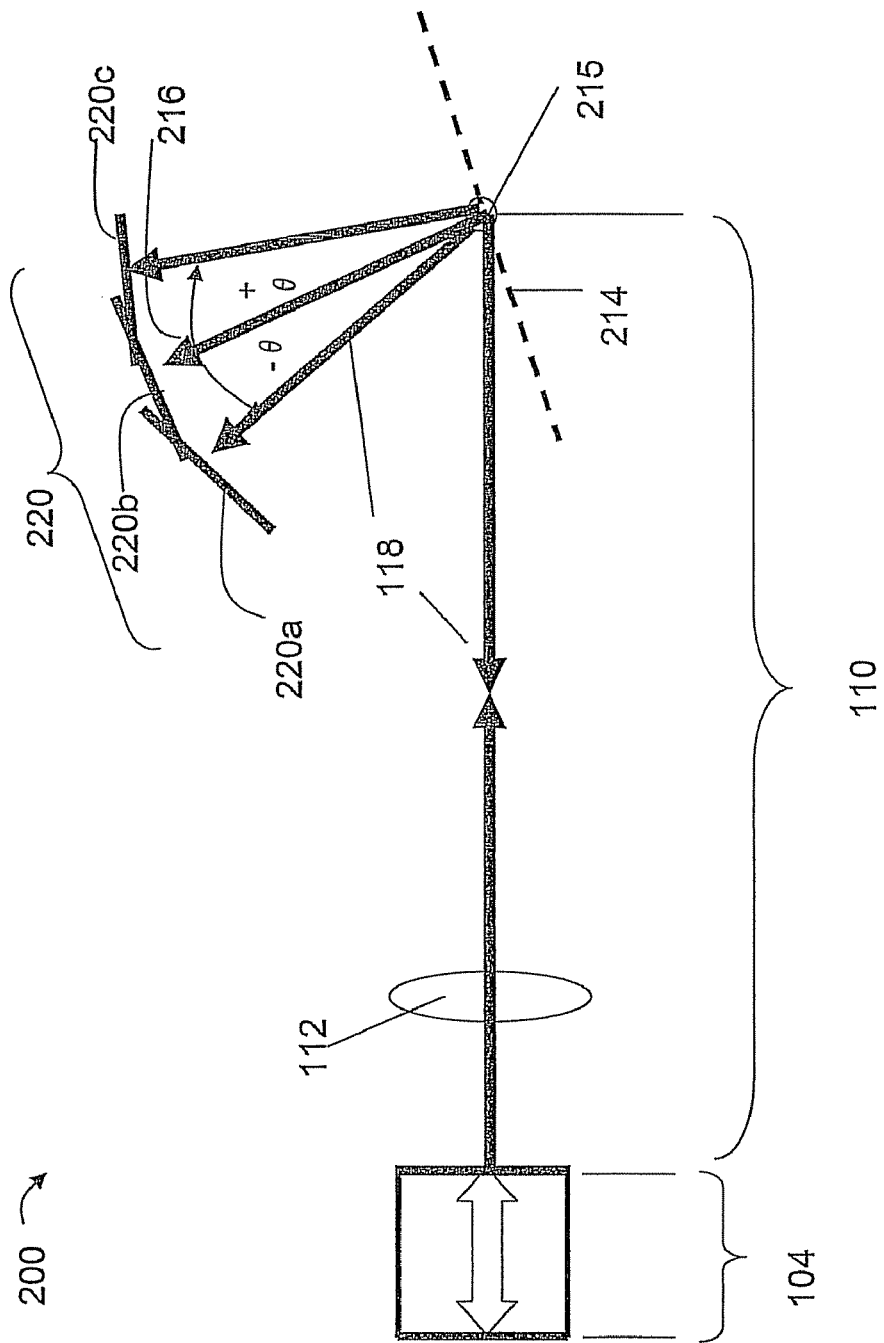
FIG. 2 shows a schematic of a frequency-stepped, external cavity laser in a modified Littman configuration having a reflective mirror oriented at different pivot angles with respect to a fixed reflective grating that produces correspondingly different lasing wavelengths within the bandwidth of the external cavity tunable laser, in embodiments of the disclosure.

In the configurations of both FIGS. 1 and 2, a standard uncoated laser diode (LD) (102) having an internal cavity (104) is coupled into an external cavity (110) by a collimating lens (112), or like dispersive element. The external cavity (110) or (118) includes the distance between the fixed grating and the pivoting mirror. In the prior art Littrow configuration of FIG. 1, a rotatable diffractive optic element such as a grating (114) having a rotational axis (115) and further having a grating angle θ (116), is adjusted such that the first order reflection (118) is directed back into the laser diode. The grating (114) can be rotated about the axis (115). The rotational axis (115) is co-planar with the face of the grating, parallel to the rulings on the face of the grating, and normal to the incident and reflected beams. By making small changes to the grating angle θ the wavelength of the light that is fed back into the laser diode can be changed and thus change the laser wavelength output light ($P_o$) (125). A fixed reflective optic such as a mirror (120) receives the zero-eth order reflection (122).

A partial schematic of the disclosed laser apparatus (200) and system is shown in FIG. 2, having a controllably pivotal reflective mirror (220) oriented at, for example, different (three shown: 220a, 220b, 220c) pivot angles with respect to the fixed reflective mirror (214) that produces correspondingly different lasing wavelengths within the bandwidth of the external cavity tunable laser. The pivot point (215) for the reflective mirror (220) can be selected to be, for example, on the face of the reflective grating (214) so that the external cavity length remains constant throughout the tuning bandwidth. In the modified Littman configuration of the disclosure of FIG. 2, the tuning angle θ (216) of the reflective mirror (220) can be controllably pivotally adjusted about a remote locus (215), such as at an imaginary or actual point or pivotal axis situated at the rotationally and pivotally fixed reflective grating (214), so that the first order reflection (118) can be directed back into the internal cavity of the laser diode (104). By making small pivotal changes to the reflective mirror angle θ (216), for example, about 200 steps over about 3 degrees of pivot range, the wavelength of the light that is fed back into the laser diode is changed and changes the laser's wavelength in a stepwise manner. The mirror (220) can be pivoted about a remote pivotal axis (215) which can be, for example, co-planar with the face of the fixed grating and parallel to the rulings on the face of the grating.

Figure 3:
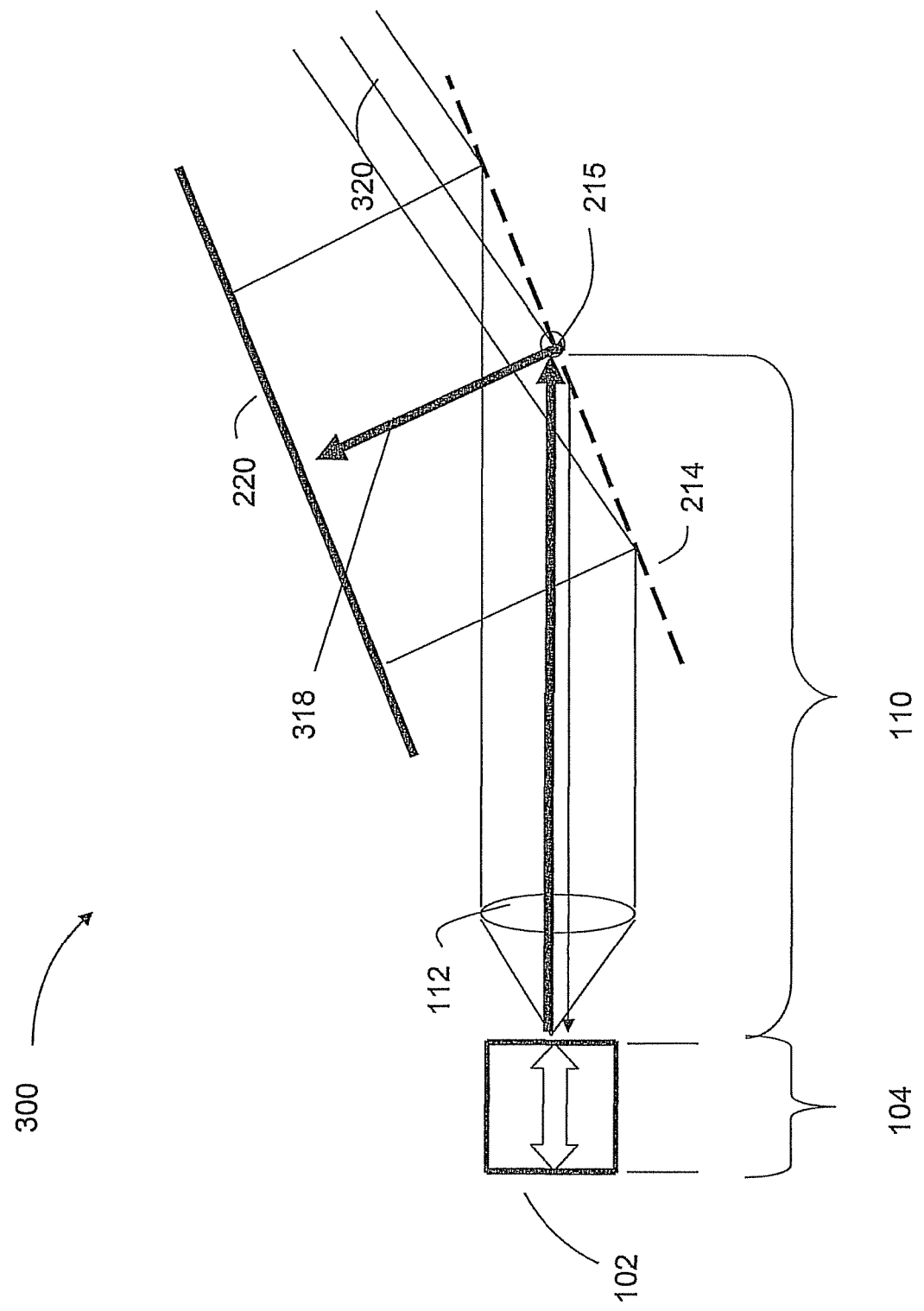
FIG. 3 shows a second schematic of a frequency-stepped, external cavity laser in the modified Littman configuration, in embodiments of the disclosure.

FIG. 3 shows a partial schematic of the disclosed system (300) having a frequency-stepped, external cavity laser in the Littman configuration. In this configuration, the reflective grating (214) is held at a fixed angle so that the first ($1^{st}$) order reflection is incident on the pivotally adjustable reflective mirror (220). The adjustable reflective mirror can be changed so that the angle of the reflected beam (318) is altered. This changes the lasing wavelength of the tunable laser. Having the pivot point (215) of the reflective mirror (220) situated on or at the face of the reflective grating (214) permits the external cavity length (110) to be held constant while the laser is tuned across the operating bandwidth.

An objective of the configurations of FIGS. 2 and 3 is to keep the external cavity length (110) constant as the laser is angle tuned over the operating bandwidth. The fixed length of the external cavity (110) is selected so that it is mode-matched to the fundamental laser diode (102). An example of mode-matching to the fundamental laser diode is schematically shown in FIG. 4.

Figure 4:
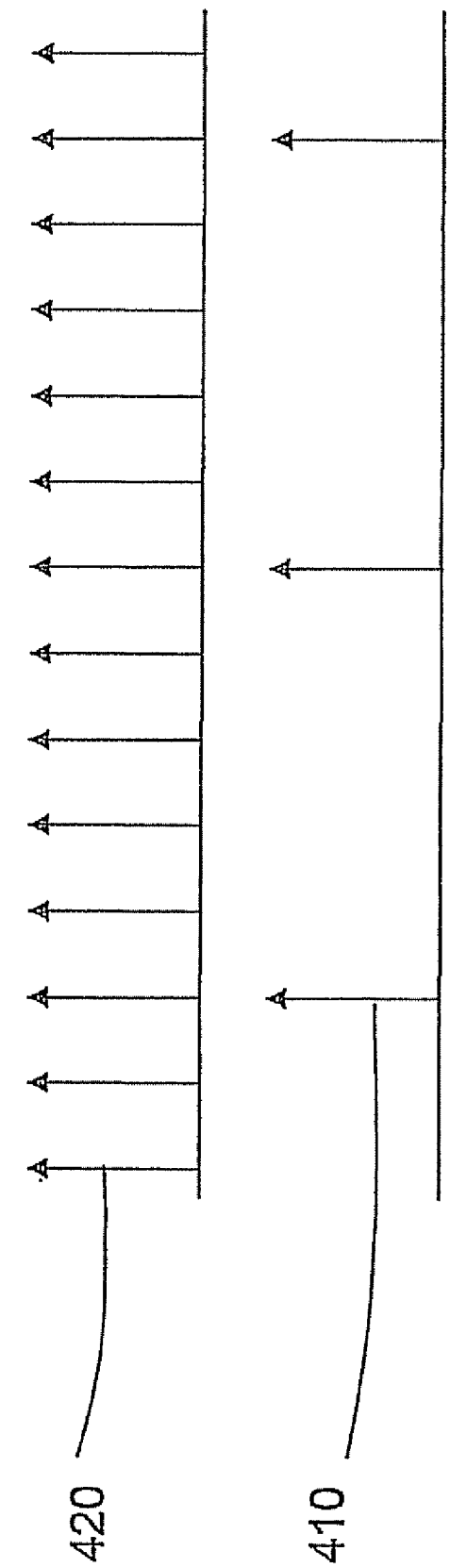
FIG. 4 shows an exemplary result of proper mode-matching between the external cavity and the fundamental laser diode cavity, in embodiments of the disclosure.

FIG. 4 shows an exemplary result of proper mode-matching between the external cavity and the fundamental laser diode cavity. The mode spacing for the laser diode is an integer multiple of the external cavity modes. In the embodiment illustrated (not drawn to scale), the optical path length of the external cavity is selected to be five fold (5×) that of the optical path length of the fundamental laser diode mode. The spacing of the cavity modes of the fundamental laser diode (410) is an integer multiple of the spacing of the longitudinal modes of external cavity (420). As the tuning angle (216) or mirror angle θ is continuously changed, the laser frequency will change in discrete frequency steps called mode hops. In an ideal mode-matched condition, the mode hops or frequency steps are determined by the length of the fundamental laser diode (104) and its optical index of refraction.

In either the Littrow or the Littman configuration accomplishing frequency step tuning requires that a mode-match of the primary or fundamental laser diode mode spacing be an integer multiple of the external cavity mode spacing.

EXAMPLES

The following examples serve to more fully describe the manner of using the above-described disclosure, and to set forth examples of the best modes contemplated for carrying out various aspects of the disclosure. These examples do not limit the scope of this disclosure, but rather are presented for illustrative purposes.

Example 1

Figure 5:
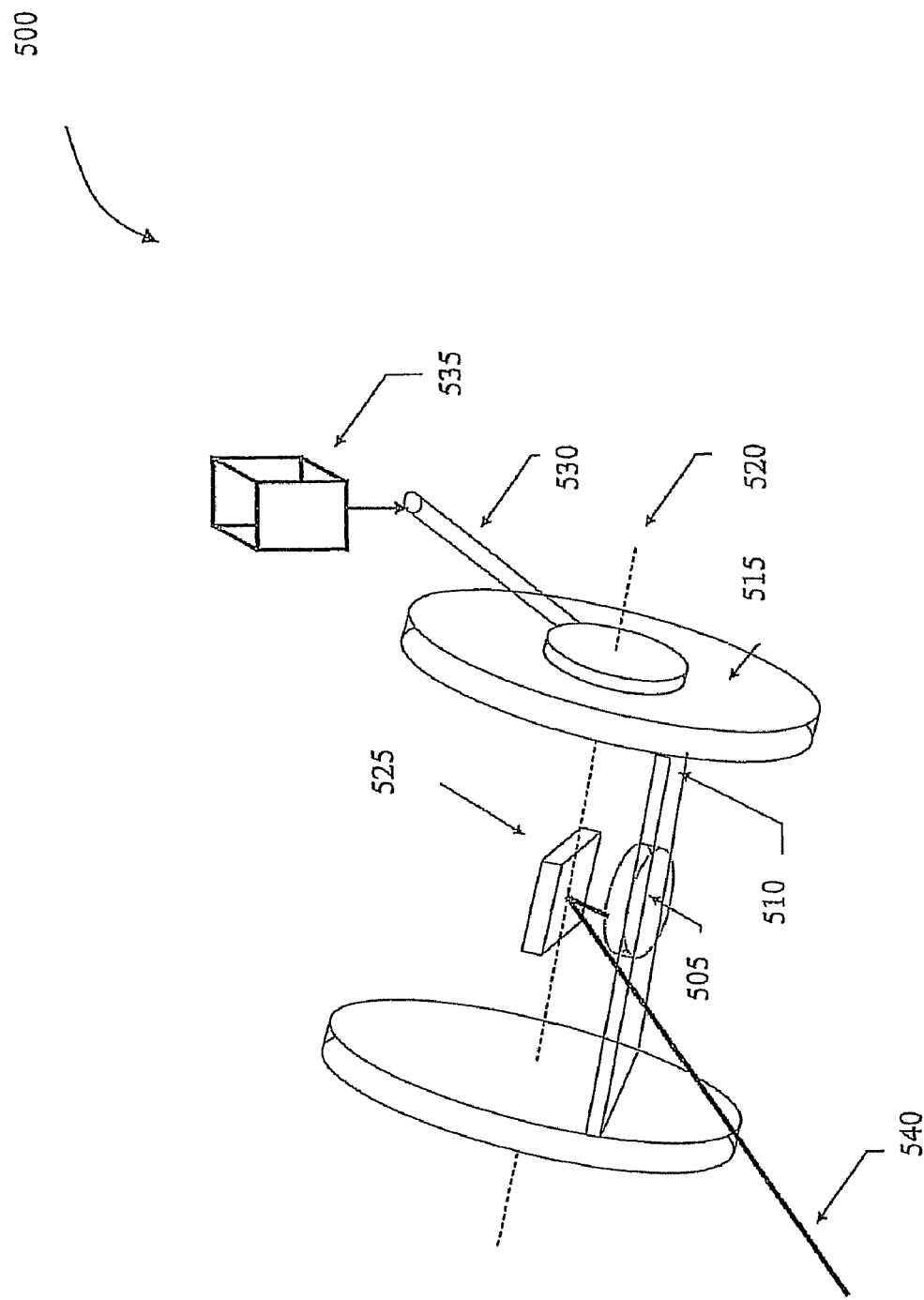
FIG. 5 shows in a perspective view an exemplary implementation of a Littman configured stepped laser, in embodiments of the disclosure.

There are numerous variations and alternatives that can be used to implement the apparatus and method of the disclosure. One example apparatus configuration (500) is illustrated in the perspective view of FIG. 5. A pivotable mirror (505) is mounted on a mirror support plate (510) that is remotely attached to a rotating axle (515) assembly. The axle (515) is positioned such that the axis of rotation (520) is mechanically aligned with, for example, the face of the fixed grating (525) and parallel to the grooves on the fixed grating (525). The grating (525) is fixed, and all of its mechanical adjustments can be made independently of the rotating axle. A lever arm (530) can be attached to the axle and can be actuated by, for example, a linear motor (535). An laser beam (540) from an external cavity can illuminate the fixed grating (525) and the pivotable mirror (505). The linear motor can be of any suitable type or model. In embodiments the linear motor can be, for example, a stepper-motor, a voice coil assembly, a piezo actuator, or a DC motor. The travel range of the motor can depend on, for example, the length of the lever arm. The length of the arm can be optimized to match the performance of the selected motor. For example, small voice coil assemblies that can travel over a range of 6 mm and a 100 mm arm would allow the mirror angle to be varied over about 3 degrees.

The disclosure has been described with reference to various specific embodiments and techniques. However, many variations and modifications are possible while remaining within the spirit and scope of the disclosure.

What is claimed is:

1. A wavelength tunable system comprising:
a laser having an internal lasing cavity and an external cavity, the cavities having a common optical axis, the internal lasing cavity and the external cavity each has an optical path length determined by the optical index of refraction and the physical length of their respective cavities, and the length of the external cavity is a constant;
a reflective grating fixed in the external cavity;
a collimating lens between the internal lasing cavity and the reflective grating; and
an adjustable reflective mirror defining one end of the external cavity and optically coupled to the fixed reflective grating,
the adjustable reflective mirror pivots about an axis on the face of the fixed reflective grating, and the optical path length of the external cavity is an integer multiple of the optical path length of the internal lasing cavity.

2. The system of claim 1 wherein the adjustable reflective mirror pivots about a remote axis, which axis is co-planar with the face of the reflective grating, parallel to the rulings on the grating face, and intersecting the optical axis of the external cavity.

3. The system of claim 1 wherein the wavelength of the laser's output beam is changed discretely by successively stepping to different angles for the reflective mirror.

4. The system of claim 1 wherein the laser comprises an optical amplifier.

5. The system of claim 1 wherein the first order reflection is incident on the adjustable reflective mirror.

6. The system of claim 1 wherein the direction of the zero-eth order reflection is unchanged and is not incident on the adjustable reflective mirror.

7. A method for wavelength tuning a laser, the method comprising:
providing the system of claim 1; and
sequentially or successively orienting the adjustable reflective mirror in N respective pivot positions of angle $\theta_N$ relative to the fixed reflective grating to output a beam having a series of respective wavelengths $\lambda_N$.

8. The method of claim 7 wherein N is an integer from 2 to about 10,000.

9. The method of claim 7 wherein N is an integer from 2 to about 200.

10. The method of claim 7 wherein N is an integer from 2 to about 100.

11. The method of claim 7 wherein angle $\theta_N$ is from about 1 to about 5 degrees.

12. The method of claim 7 wherein angle $\theta_N$ is from about 2 to about 4 degrees.

13. The method of claim 7 wherein angle $\theta_N$ is about 3 degrees and N is an integer from 2 to about 200.

14. A method for wavelength tuning a laser in an interrogating biosensor apparatus, the method comprising:
orienting the adjustable reflective mirror of the tunable system of claim 1 in a series of successive pivot positions of angle $\theta_N$ relative to the reflective grating to output a beam having a series of respective wavelengths $\lambda_N$;
directing the beam to illuminate a grating-based, waveguide biosensor;
collecting the reflected radiation from the biosensor to measure the relative intensities of the reflected radiation at the different respective wavelengths $\lambda_N$; and
analyzing the collected intensity versus wavelength data to determine the maximum peak wavelength response of the biosensor.

15. The system of claim 1 wherein the laser is free of an anti-reflective coating.

* * * * *